United States Patent
Wang et al.

(10) Patent No.: US 8,472,151 B2
(45) Date of Patent: Jun. 25, 2013

(54) TMR DEVICE WITH LOW MAGNETORESTRICTION FREE LAYER

(75) Inventors: Hui-Chuan Wang, Pleasanton, CA (US); Tong Zhao, Fremont, CA (US); Min Li, Dublin, CA (US); Kunliang Zhang, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/444,497

(22) Filed: Apr. 11, 2012

(65) Prior Publication Data

US 2012/0193738 A1    Aug. 2, 2012

Related U.S. Application Data

(62) Division of application No. 11/983,329, filed on Nov. 8, 2007, now abandoned.

(51) Int. Cl.
*G11B 5/33* (2006.01)
*G11B 5/127* (2006.01)

(52) U.S. Cl.
USPC ............................................. 360/324.12

(58) Field of Classification Search
USPC .................................... 360/313–328
See application file for complete search history.

(56) References Cited

U.S. PATENT DOCUMENTS

| 7,035,058 B2 | 4/2006 | Hosomi |
| 7,333,306 B2 | 2/2008 | Zhao et al. |
| 7,800,868 B2 | 9/2010 | Gao et al. |
| 7,813,088 B2 | 10/2010 | Tsunekawa et al. |
| 7,918,014 B2 | 4/2011 | Zhang et al. |
| 2006/0114621 A1* | 6/2006 | Wang et al. .............. 360/324.12 |
| 2007/0070553 A1* | 3/2007 | Tsunekawa et al. .......... 360/313 |

* cited by examiner

*Primary Examiner* — Joseph Haley
*Assistant Examiner* — Gustavo Polo
(74) *Attorney, Agent, or Firm* — Saile Ackerman LLC; Stephen B. Ackerman

(57) ABSTRACT

A high performance TMR sensor is fabricated by employing a free layer with a trilayer configurations represented by FeCo/CoFeB/CoB, FeCo/CoB/CoFeB, FeCo/CoFe/CoB, or FeCo/FeB/CoB may also be employed. Alternatively, CoNiFeB or CoNiFeBM formed by co-sputtering CoB with CoNiFe or CoNiFeM, respectively, where M is V, Ti, Zr, Nb, Hf, Ta, or Mo may be included in a composite free layer or as a single free layer in the case of CoNiFeBM. A 15 to 30% in improvement in TMR ratio over a conventional CoFe/NiFe free layer is achieved while maintaining low Hc and RA<3 ohm-um$^2$. In bilayer or trilayer embodiments, magnetostriction ($\lambda$) between $-5\times10^{-6}$ and $5\times10^{-6}$ is achieved by combining CoB ($-\lambda$) and one or more layers having a positive $\lambda$.

5 Claims, 1 Drawing Sheet

TMR DEVICE WITH LOW MAGNETORESTRICTION FREE LAYER

This is a Divisional application of U.S. patent application Ser. No. 11/983,329, filed on Nov. 8, 2007, which is herein incorporated by reference in its entirety, and assigned to a common assignee.

RELATED PATENT APPLICATION

This application is related to the following: U.S. Pat. No. 7,918,014, assigned to a common assignee, and which is herein incorporated by reference in its entirety.

FIELD OF THE INVENTION

The present disclosure relates to a high performance tunneling magnetoresistive (TMR) sensor in a read head and a method for making the same, and in particular, to a composite free layer comprised of CoB that reduces magnetostriction while achieving acceptable RA (resistance×area) and dR/R values.

BACKGROUND

A TMR sensor otherwise known as a magnetic tunneling junction (MTJ) is a key component (memory element) in magnetic devices such as Magnetic Random Access Memory (MRAM) and a magnetic read head. A TMR sensor typically has a stack of layers with a configuration in which two ferromagnetic layers are separated by a thin non-magnetic insulator layer. The sensor stack in a so-called bottom spin valve configuration is generally comprised of a seed (buffer) layer, anti-ferromagnetic (AFM) layer, pinned layer, tunnel barrier layer, free layer, and capping layer that are sequentially formed on a substrate. The free layer serves as a sensing layer that responds to external fields (media field) while the pinned layer is relatively fixed and functions as a reference layer. The electrical resistance through the tunnel barrier layer (insulator layer) varies with the relative orientation of the free layer moment compared with the reference layer moment and thereby converts magnetic signals into electrical signals. In a magnetic read head, the TMR sensor is formed between a bottom shield and a top shield. When a sense current is passed from the top shield to the bottom shield (or top conductor to bottom conductor in a MRAM device) in a direction perpendicular to the planes of the TMR layers (CPP designation), a lower resistance is detected when the magnetization directions of the free and reference layers are in a parallel state ("1" memory state) and a higher resistance is noted when they are in an anti-parallel state or "0" memory state. Alternatively, a TMR sensor may be configured as a current in plane (CIP) structure which indicates the direction of the sense current.

A giant magnetoresistive (GMR) head is another type of memory device. In this design, the insulator layer between the pinned layer and free layer in the TMR stack is replaced by a non-magnetic conductive layer such as copper.

In the TMR stack, the pinned layer may have a synthetic anti-ferromagnetic (SyAF) configuration in which an outer pinned layer is magnetically coupled through a coupling layer to an inner pinned layer that contacts the tunnel barrier. The outer pinned layer has a magnetic moment that is fixed in a certain direction by exchange coupling with the adjacent AFM layer which is magnetized in the same direction. The tunnel barrier layer is so thin that a current through it can be established by quantum mechanical tunneling of conduction electrons.

A TMR sensor is currently the most promising candidate for replacing a GMR sensor in upcoming generations of magnetic recording heads. An advanced TMR sensor may have a cross-sectional area of about 0.1 microns×0.1 microns at the air bearing surface (ABS) plane of the read head. The advantage of a TMR sensor is that a substantially higher MR ratio can be realized than for a GMR sensor. In addition to a high MR ratio, a high performance TMR sensor requires a low areal resistance RA (area×resistance) value, a free layer with low magnetostriction ($\lambda$) and low coercivity (Hc), a strong pinned layer, and low interlayer coupling (Hin) through the barrier layer. The MR ratio (also referred to as TMR ratio) is dR/R where R is the minimum resistance of the TMR sensor and dR is the change in resistance observed by changing the magnetic state of the free layer. A higher dR/R improves the readout speed. For high recording density or high frequency applications, RA must be reduced to about 1 to 3 ohm-um$^2$.

A MgOx based MTJ is a very promising candidate for high frequency recording applications because its tunneling magnetoresistive (TMR) ratio is significantly higher than for AlOx or TiOx based MTJs. In order to achieve a smaller Hc but still maintain a high TMR ratio, the industry tends to use CoFeB as the free layer in a TMR sensor. Unfortunately, the magnetostriction ($\lambda$) of a CoFeB free layer is considerably greater than the maximum acceptable value of about $5 \times 10^{-6}$ for high density memory applications. A free layer made of a CoFe/NiFe composite has been employed instead of CoFeB because of its low $\lambda$ and soft magnetic properties. However, when using a CoFe/NiFe free layer, the TMR ratio will degrade. Thus, an improved free layer in a TMR sensor is needed that provides low magnetostriction in combination with a high TMR ratio, low RA value, and low coercivity.

SUMMARY

One objective of the present disclosure is to provide a TMR sensor with a free layer composition that improves the TMR ratio by at least 15 to 30% compared with a conventional FeCo/NiFe free layer.

A second objective of the present disclosure is to provide a TMR sensor with a free layer according to the first objective that also has a low magnetostriction between $-5 \times 10^{-6}$ and $5 \times 10^{-6}$, a low RA value below 3 ohm-µm$^2$, and a low coercivity in the range of 4 to 6 Oe.

A further objective of the present disclosure is to provide a method of forming a TMR sensor that satisfies the first and second objectives and is cost effective.

According to one embodiment of the present disclosure, these objectives are achieved by forming a TMR sensor on a suitable substrate such as a bottom shield in a read head. The TMR sensor may have a bottom spin valve configuration comprised of a seed layer, AFM layer, pinned layer, tunnel barrier layer, free layer, and capping layer which are formed sequentially on the bottom shield. The tunnel barrier layer is made of MgOx and the free layer is comprised of a low magnetostriction CoB$_X$ layer where x is from 0 to 30 atomic %, or a FeB$_V$ layer where v is from 0 to 30 atomic %. In an alternative embodiment, the free layer is a composite represented by a FeCo$_Y$/CoB$_X$ configuration where y is from 0 to 100 atomic % and the FeCo$_Y$ layer contacts the tunnel barrier layer. Optionally, the free layer may have a trilayer configuration represented by FeCo$_Y$/CoFe$_W$B$_Z$/CoB$_X$, FeCo$_Y$/CoB$_X$/CoFe$_W$B$_Z$, FeCo$_Y$/CoFe$_V$/CoB$_X$, or FeCo$_Y$/FeB/CoB$_X$ where w is from 0 to 70 atomic %, v is from 0 to 100 atomic % and is unequal to y, and z is from 0 to 30 atomic %.

In a second embodiment, the tunnel barrier layer is made of MgO and the free layer may have a configuration represented by $FeCo_y/Co_PNi_RFe_SB_T$ in which the CoNiFeB layer is formed by co-sputtering targets made of CoB and CoNiFe, and p is from 5 to 90 atomic %, r is from 5 to 20 atomic %, s is between 5 and 90 atomic %, t is from 1 to 30 atomic %, and p+r+s+t=100 atomic %. Alternatively, the free layer may have a trilayer configuration represented by $FeCo_y/CoFe_WB_Z/Co$-NiFeB, $FeCo_y/CoNiFeB/CoFe_WB_Z$, $FeCo_y/CoFe_V/CoN$-iFeB, or $FeCo_y/FeB/CoNiFeB$ where the CoNiFeB layer is made by co-sputtering CoB and CoNiFe. In yet another embodiment, the CoNiFeB layer in one of the previous embodiments may be replaced by a CoNiFeBX layer that is formed by co-sputtering CoB with CoNiFeX where X is an element such as V, Ti, Zr, Nb, Hf, Ta, or Mo and the content of the X element in the CoNiFeBX layer is <10 atomic %.

Typically, a TMR stack of layers is laid down in a sputtering system. All of the layers may be deposited in the same sputter chamber. Preferably, the MgO tunnel barrier is formed by depositing a first Mg layer on the pinned layer followed by a natural oxidation process on the first Mg layer to form a MgO layer and then depositing a second Mg layer on the MgO layer. The oxidation step is performed in an oxidation chamber within the sputtering system. The TMR stack is patterned by a conventional method prior to forming a top shield on the cap layer.

DETAILED DESCRIPTION

The present disclosure is a high performance TMR sensor having a free layer comprised of CoB or CoNiFeBX and a method for making the same. While the exemplary embodiment depicts a TMR sensor in a read head, the present disclosure may be employed in other devices based on a tunneling magnetoresistive element such as MRAM structures, or in a GMR-CPP sensor. The TMR sensor may have a bottom spin valve, top spin valve, or multilayer spin value configuration as appreciated by those skilled in the art. Drawings are provided by way of example and are not intended to limit the scope of the invention. For example, various elements are not necessarily drawn to scale and their relative sizes may differ compared with those in an actual device.

Figure 1:
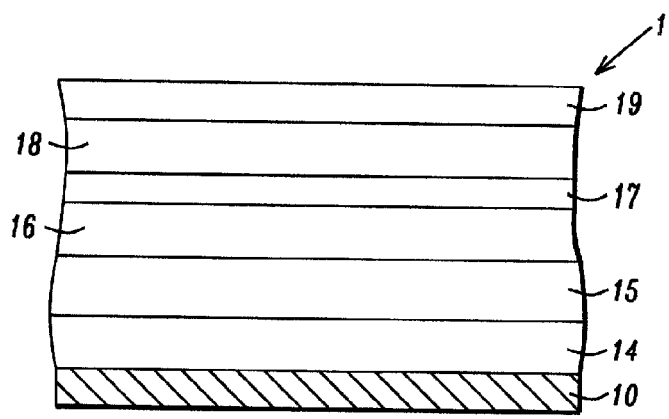
FIG. 1 is a cross-sectional view showing a TMR stack of layers according to one embodiment of the present disclosure.

Referring to FIG. 1, a portion of a partially formed TMR sensor 1 of the present disclosure is shown from the plane of an air bearing surface (ABS). There is a substrate 10 that in one embodiment is a bottom lead otherwise known as a bottom shield (S1) which may be a NiFe layer about 2 microns thick that is formed by a conventional method on a substructure (not shown). It should be understood that the substructure may be comprised of a wafer made of AlTiC, for example.

A TMR stack is formed on the substrate 10 and in the exemplary embodiment has a bottom spin valve configuration wherein a seed layer 14, AFM layer 15, pinned layer 16, tunnel barrier layer 17, free layer 18, and capping layer 19 are sequentially formed on the substrate. The seed layer 14 may have a thickness of 10 to 100 Angstroms and is preferably a Ta/Ru composite but Ta, Ta/NiCr, Ta/Cu, Ta/Cr or other seed layer configurations may be employed, instead. The seed layer 14 serves to promote a smooth and uniform grain structure in overlying layers. Above the seed layer 14 is an AFM layer 15 used to pin the magnetization direction of the overlying pinned layer 16, and in particular, the outer portion or AP2 layer (not shown). The AFM layer 15 has a thickness from 40 to 300 Angstroms and is preferably comprised of IrMn. Optionally, one of PtMn, NiMn, OsMn, RuMn, RhMn, PdMn, RuRhMn, or MnPtPd may be employed as the AFM layer.

The pinned layer 16 preferably has a synthetic anti-parallel (SyAP) configuration represented by AP2/Ru/AP1 where a coupling layer made of Ru, Rh, or Ir, for example, is sandwiched between an AP2 layer and an AP1 layer (not shown). The AP2 layer which is also referred to as the outer pinned layer is formed on the AFM layer 15 and may be made of CoFe with a composition of about 10 atomic % Fe and with a thickness of about 10 to 50 Angstroms. The magnetic moment of the AP2 layer is pinned in a direction anti-parallel to the magnetic moment of the AP1 layer. For example, the AP2 layer may have a magnetic moment oriented along the "+x" direction while the AP1 layer has a magnetic moment in the "−x" direction. A slight difference in thickness between the AP2 and AP1 layers produces a small net magnetic moment for the pinned layer 16 along the easy axis direction of the TMR sensor to be patterned in a later step. Exchange coupling between the AP2 layer and the AP1 layer is facilitated by a coupling layer that is preferably comprised of Ru with a thickness from 3 to 9 Angstroms. The AP1 layer is also referred to as the inner pinned layer and may be a single layer or a composite layer. In one aspect, the AP1 layer is amorphous in order to provide a more uniform surface on which to form the tunnel barrier layer 17.

In the exemplary embodiment that features a bottom spin valve configuration, the tunnel barrier layer 17 is comprised of MgO because a MgO tunnel barrier is known to provide a higher TMR ratio than a TMR stack made with an AlOx or TiOx tunnel barrier. The MgO tunnel barrier layer is preferably formed by depositing a first Mg layer having a thickness between 4 and 14 Angstroms on the pinned layer 16, oxidizing the Mg layer with a natural oxidation (NOX) process, and then depositing a second Mg layer with a thickness of 2 to 8 Angstroms on the oxidized first Mg layer. Thus, the tunnel barrier is considered as having a MgO/Mg configuration. The second Mg layer serves to protect the subsequently deposited free layer from oxidation. It is believed that excessive oxygen accumulates at the top surface of the MgO layer as a result of the NOX process and this oxygen can oxidize a free layer that is formed directly on the MgOx portion of the tunnel barrier layer. Note that the RA and MR ratio for the TMR sensor may be adjusted by varying the thickness of the two Mg layers in tunnel barrier layer 17 and by varying the natural oxidation time and pressure. A thicker MgO layer resulting from longer oxidation time and/or higher pressure would increase the RA value.

All layers in the TMR stack may be deposited in a DC sputtering chamber of a sputtering system such as an Anelva C-7100 sputter deposition system which includes ultra high vacuum DC magnetron sputter chambers with multiple targets and at least one oxidation chamber. Typically, the sputter deposition process involves an argon sputter gas and a base pressure between $5 \times 10^{-8}$ and $5 \times 10^{-9}$ torr. A lower pressure enables more uniform films to be deposited.

The NOX process may be performed in an oxidation chamber within the sputter deposition system by applying an oxygen pressure of 0.1 mTorr to 1 Torr for about 15 to 300 seconds. In the exemplary embodiment, no heating or cooling is applied to the oxidation chamber during the NOX process. Oxygen pressure between $10^{-6}$ and 1 Torr is preferred for an oxidation time mentioned above in order to achieve a RA in the range of 0.5 to 5 ohm-um$^2$. A mixture of $O_2$ with other inert gases such as Ar, Kr, or Xe may also be used for better control of the oxidation process.

The present disclosure anticipates that a MgO barrier layer 17 could be formed by depositing a MgO layer on pinned layer with a rf-sputtering or reactive sputtering method. It should be understood that the performance of a TMR sensor fabricated with a barrier layer comprised of sputtered MgO will not be as desirable as one made according to the preferred embodiment of this disclosure. For example, the inventors have observed that the final RA uniformity (1σ) of 0.6 um circular devices is more than 10% when the MgO tunnel barrier layer is rf-sputtered and less than 3% when the MgO tunnel barrier is formed by DC sputtering a Mg layer followed by a NOX process.

Optionally, other materials such as TiOx, TiAlOx, MgZnOx, AlOx, ZnOx, or any combination of the aforementioned materials including MgO may be used as the tunnel barrier layer 21.

Returning to FIG. 1, an important feature of the present disclosure is the free layer 18 formed on the tunnel barrier layer 17. In one embodiment, the free layer 18 has a thickness from 20 to 60 Angstroms and is comprised of a low magnetostriction $CoB_X$ layer where x is from about 1 to 30 atomic % and λ is preferably between $-5\times10^{-6}$ and 0, or a FeB layer wherein the boron content is from 1 to 30 atomic % and λ is preferably between 0 and $5\times10^{-6}$. It should be understood that in a binary composition, the total atomic % for the two elements is 100 atomic %. In an alternative bilayer embodiment, the free layer 18 is a composite represented by a $FeCo_Y/CoB_X$ configuration where y is from 0 to 100 atomic % and the $FeCo_Y$ layer contacts the tunnel barrier layer 17. The $FeCo_Y$ layer may have a thickness between 2 and 10 Angstroms and the $CoB_X$ layer may be from 20 to 50 Angstroms thick. Optionally, the free layer 18 may have a trilayer configuration represented by $FeCo_Y/Co_UFe_WB_Z/CoB_X$, $FeCo_Y/CoB_X/Co_UFe_WB_Z$, $FeCo_Y/CoFe_V/CoB_X$, or $FeCo_Y/FeB/CoB_X$ where u is from 1 to 95 atomic %, w is from 0 to 70 atomic %, v is between 0 and 100 atomic % and is unequal to y, z is 1 to 30 atomic %, and u+w+z=100 atomic % In the trilayer embodiments, the $FeCo_Y$ and $CoFe_V$ layers have a thickness between 2 and 10 Angstroms and y is unequal to v, the $CoB_X$ layer has a thickness from 20 to 40 Angstroms, the $Co_UFe_WB_Z$ layer is from 5 to 20 Angstroms thick, and the $CoFe_V$ and FeB layers have a thickness between 2 and 10 Angstroms.

The inventors have discovered that a $CoB_X$ layer with a small negative magnetostriction between $-5\times10^{-6}$ and 0, or a FeB layer with a small positive magnetostriction between 0 and $5\times10^{-6}$ may be used as a free layer to afford a 15 to 30% improvement in TMR ratio compared with a conventional FeCo/NiFe free layer and still maintain low Hc (4-6 Oe) and low RA values necessary for high performance TMR sensors. Alternatively, a $CoB_X$ layer with a small negative λ may be combined with one or more materials having a positive λ value to form a free layer composite with a bilayer or trilayer configuration having a λ value between $-5\times10^{-6}$ and $5\times10^{-6}$ with TMR ratio, RA, and Hc values similar to those described for a $CoB_X$ free layer.

In an alternative embodiment, the free layer 18 may have a configuration represented by $Co_PNi_RFe_SB_T$ or $FeCo_Y/Co_PNi_RFe_SB_T$ in which the CoNiFeB layer may be formed by co-sputtering targets made of CoB and CoNiFe or CoNiFeB, and p is from 5 to 90 atomic %, r is from 5 to 20 atomic %, s is between 5 and 90 atomic %, t is from about 1 to 30 atomic %, and p+r+s+t=100 atomic %. Alternatively, the free layer 18 may have a trilayer configuration represented by $FeCo_Y/CoFe_WB_Z/Co_PNi_RFe_SB_T$, $FeCo_Y/Co_PNi_RFe_SB_T/CoFe_WB_Z$, $FeCo_Y/CoFe_V/Co_PNi_RFe_SB_T$, or $FeCo_Y/FeB/Co_PNi_RFe_SB_T$ where the CoNiFeB layer is made by co-sputtering CoB and CoNiFe, or CoB and CoNiFeB. CoB is preferably used in the co-sputtering process as a means of adjusting λ.

In another embodiment, CoB may be co-sputtered with CoNiFeM where M is V, Ti, Zr, Nb, Hf, Ta, or Mo to produce a free layer 18 represented by CoNiFeBM in which the M content is >0 atomic % and <10 atomic %. Moreover, the present disclosure also anticipates that the free layer 18 may have a $FeCo_Y$/CoNiFeBM configuration. Optionally, a CoNiFeBM layer may be substituted for the CoNiFeB layer in one of the aforementioned trilayer configurations. Preferably, the CoNiFeB layer and CoNiFeBM layer in the embodiments described herein have a λ between $-5\times10^{-6}$ and $5\times10^{-6}$. A magnetic layer comprised of CoNiFeB or CoNiFeBM in combination with one or more other magnetic materials such as FeCo is expected to provide a similar improvement in TMR ratio compared to a FeCo/NiFe layer while maintaining low RA and low Hc values.

Once the TMR stack is complete, the partially formed read head 1 may be annealed in a vacuum oven within the range of 240° C. to 340° C. with an applied magnetic field of at least 2000 Oe, and preferably 8000 Oe for about 2 to 10 hours to set the pinned layer and free layer magnetization directions. It should be understood that under certain conditions, depending upon the time and temperature involved in the anneal process, the tunnel barrier layer 17 may become a uniform MgO tunnel barrier layer as unreacted oxygen diffuses into the adjacent Mg layer.

Figure 2:
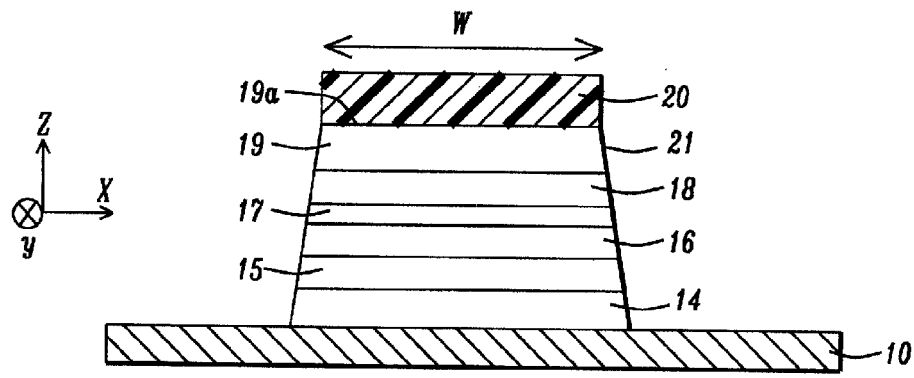
FIG. 2 is a cross-sectional view showing a TMR stack of layers that has been patterned to form a MTJ element during an intermediate step of fabricating the TMR sensor according to one embodiment of the present disclosure.

Referring to FIG. 2, the TMR stack is patterned by following a conventional process sequence. For example, a photoresist layer 20 having a width W may be coated on the capping layer 19. After the photoresist layer 20 is patterned, a reactive ion etch (RIE), ion beam etch (IBE), or the like is used to remove underlying layers in the TMR stack that are exposed by openings in the photoresist layer. The etch process stops on the bottom shield 10 or between the bottom shield and a barrier layer (not shown) to give a TMR sensor with a top surface 19a and sidewalls 21.

Figure 3:
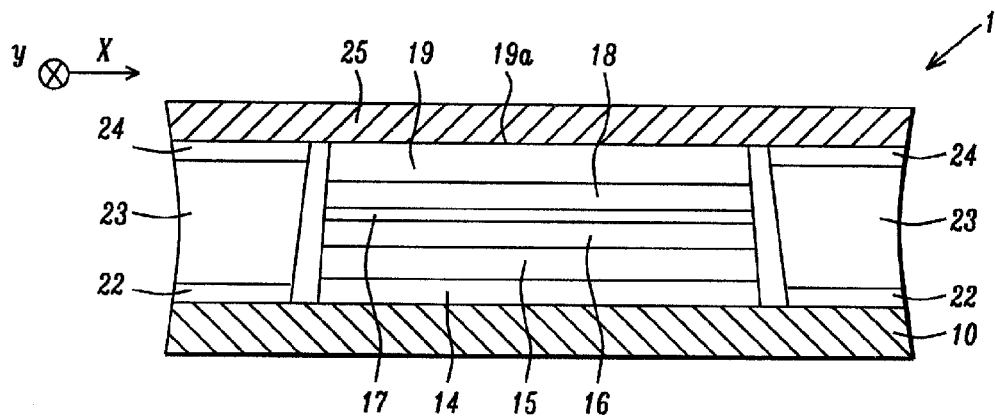
FIG. 3 is a cross-sectional view of a TMR read head having a MTJ element interposed between a top shield and bottom shield and formed according to an embodiment of the present disclosure.

Referring to FIG. 3, an insulating layer 22 may be deposited along the sidewalls 21 of the TMR sensor followed by sequential deposition of a hard bias layer 23 and a second insulation layer 24. The photoresist layer 20 is then removed by a lift off process. A top lead otherwise known as a top shield 25 is then deposited on the insulating layer 22, second insulation layer 24, and top surface 19a of the TMR sensor. Similar to the bottom shield 10, the top shield 25 may also be a NiFe layer about 2 microns thick. The TMR read head 1 may be further comprised of a second gap layer (not shown) disposed on the top shield 25.

Comparative Example 1

A first experiment was conducted to demonstrate the improved performance achieved by implementing a free layer in a TMR sensor according to the present disclosure. A TMR stack of layers, hereafter referred to as MTJ Sample 1 and shown in Table 1, was fabricated as a reference and is comprised of a conventional CoFe/NiFe free layer wherein the lower CoFe layer is 10 Angstroms thick and the upper NiFe layer is 40 Angstroms thick. MTJ Sample 1 has a seed/AFM/AP2/Ru/AP1/MgO/free layer/capping layer configuration. The pinned layer has an AP2/Ru/AP1 structure in which the AP2 layer is a 25 Angstrom thick $Co_{70}Fe_{30}$ layer, the Ru coupling layer has a 7.5 Angstrom thickness, and the AP1 layer is a 25 Angstrom thick $Co_{70}Fe_{30}$ layer. The MgO tunnel barrier was formed by depositing a 7 Angstrom thick lower Mg layer that was subjected to a NOX process before a 3 Angstrom thick upper Mg layer was deposited. The thicknesses in Angstroms of the other layers are given in parentheses: Ta(20)/Ru(20) seed layer; IrMn (70) AFM layer; and Ru(10)/Ta(60) capping layer. The TMR stack was formed on a NiFe shield and was annealed under vacuum at 250° C. for 5 hours with an applied field of 8000 Oe.

TABLE 1

Hc, λ results for TMR sensors with Seed/AFM/AP2/Ru/AP1/MgO/free/cap configurations

| MTJ Sample | Free Layer Composition | Hc (Oe) | Lambda |
|---|---|---|---|
| 1 | $Fe_{70}Co_{30}10/Ni_{90}Fe_{10}40$ | 4.13 | $1.80 \times 10^{-6}$ |
| 2 | $Fe_{70}Co_{30}3/Co_{72}Fe_8B_{20}30$ | 5.15 | $9.45 \times 10^{-6}$ |
| 3 | $Fe_{70}Co_{30}3/Co_{80}B_{20}30$ | 4.38 | $1.20 \times 10^{-6}$ |
| 4 | $Fe_{70}Co_{30}3/Co_{72}Fe_8B_{20}10/Co_{80}B_{20}30$ | 5.49 | $4.00 \times 10^{-6}$ |
| 5 | $Fe_{70}Co_{30}3/Co_{72}Fe_8B_{20}10/CoB$—CoNiFeB co-sputter 40 | 4.26 | $3.50 \times 10^{-6}$ |

MTJ Sample 2 was fabricated with the same stack of layers as in MTJ Sample 1 except the free layer was changed to a conventional FeCo/CoFeB configuration in which the lower FeCo layer is 3 Angstroms thick and the upper CoFeB layer has a 30 Angstrom thickness. Samples 3 to 5 are MTJs in which a free layer formed according to an embodiment of the present disclosure has been inserted. For example, MTJ Sample 3 has a free layer comprised of a 3 Angstrom thick lower $Fe_{70}Co_{30}$ layer and a 30 Angstrom thick upper $Co_{80}B_{20}$ layer. MTJ Sample 4 has a 3 Angstrom thick lower $Fe_{70}Co_{30}$ layer, a 10 Angstrom thick middle $Co_{72}Fe_8B_{20}$ layer, and a 30 thick upper $Co_{80}B_{20}$ layer. MTJ Sample 5 is the same as MTJ Sample 4 except the upper CoB layer is replaced by a 40 Angstrom thick $Co_{56}Ni_8Fe_{16}B_{20}$ layer formed by co-sputtering CoB and CoNiFeB.

In Table 1, MTJ Samples 3-5 with a free layer comprised of CoB or CoNiFeB have a magnetostriction in the range of $1\times10^{-6}$ to $4\times10^{-6}$ that is substantially less than shown for MTJ Sample 2 which has a conventional CoFeB free layer. Furthermore, low Hc values are achieved with Samples 3-5 that are similar to the Hc for a conventional CoFe/NiFe free layer.

Comparative Example 2

A second experiment was performed to compare MTJ Samples 1 and 2 with MTJ Samples 3-5 with regard to TMR ratio (dR/R) and RA results. The data shown in Table 2 was generated on 6 inch device wafers with the same TMR stacks shown in FIG. 1. Note that a combination of high TMR ratio and low RA values are achieved with a free layer formed according to an embodiment of the present disclosure. In particular, MTJ Samples 3-5 exhibit a 14-25% higher TMR ratio than the reference MTJ Sample 1 while maintaining the same RA in the range of 2.3 to 2.5 ohm-μm².

TABLE 2

TMR, RA results for TMR sensors with Seed/AFM/AP2/Ru/AP1/MgO/free/cap configurations

| MTJ Sample | Free Layer Composition | RA ohm-μm² | dR/R |
|---|---|---|---|
| 1 | $Fe_{70}Co_{30}10/Ni_{90}Fe_{10}40$ | 2.40 | 51.0% |
| 2 | $Fe_{70}Co_{30}3/Co_{72}Fe_8B_{20}30$ | 2.27 | 61.5% |
| 3 | $Fe_{70}Co_{30}3/Co_{80}B_{20}30$ | 2.34 | 64.2% |
| 4 | $Fe_{70}Co_{30}3/Co_{72}Fe_8B_{20}10/Co_{80}B_{20}30$ | 2.49 | 64.0% |
| 5 | $Fe_{70}Co_{30}3/Co_{72}Fe_8B_{20}10/CoB$—CoNiFeB co-sputter 40 | 2.39 | 58.0% |

The advantages of the present disclosure are that a high TMR ratio of greater than 60% can be achieved simultaneously with a low RA value (<3 ohm-um²) and low magnetostriction which is a significant improvement over conventional TMR sensors (MTJs) based on a FeCo/NiFe free layer (low TMR ratio), or based on a FeCo/CoFeB free layer (high magnetostriction). TMR sensors formed with a free layer according to the present invention are able to achieve a 14-25% increase in TMR ratio compared with a FeCo/NiFe free layer and a 50% reduction in λ compared with a FeCo/CoFeB free layer while maintaining acceptable RA and Hc results.

The free layers disclosed in the embodiments found herein may be fabricated without additional cost since no new sputtering targets or sputter chambers are required. Furthermore, a low temperature anneal process may be employed which is compatible with the processes for making GMR sensors. Therefore, there is no change in process flow and related processes compared with current manufacturing schemes.

While this disclosure has been particularly shown and described with reference to, the preferred embodiment thereof, it will be understood by those skilled in the art that various changes in form and details may be made without departing from the spirit and scope of this disclosure.

We claim:

1. A magnetoresistive element in a magnetic device, comprising:
    (a) a stack of layers comprised of a seed layer, anti-ferromagnetic (AFM) layer, and a pinned layer sequentially formed on a substrate;
    (b) a tunnel barrier layer made of MgO on the pinned layer;
    (c) a free layer having a trilayer configuration with a lower Fe or FeCo layer formed on the tunnel barrier layer, and a stack formed on the Fe or FeCo layer consisting of a first layer made of FeB, Co, CoFe wherein the Fe content is unequal to a Fe content in the FeCo layer, or $Co_UFe_WB_Z$ where u is from about 1 to 95 atomic %, w is from 0 to about 70 atomic %, and z is from about 1 to 30 atomic %, and a second layer that is $CoB_X$ with a magnetostriction (λ) between about $-5\times10^{-6}$ and 0; and
    (d) a capping layer on the free layer.

2. The magnetoresistive element of claim 1 wherein the first layer is $Co_UFe_WB_Z$ with a thickness of about 5 to 20 Angstroms that contacts a top surface of the $FeCo_Y$ layer, the lower $FeCo_Y$ layer has a thickness between about 2 and 10 Angstroms, and the $CoB_X$ layer is the uppermost layer in the trilayer configuration and has a thickness between about 20 and 40 Angstroms.

3. The magnetoresistive element of claim 1 wherein the $CoB_X$ layer contacts a top surface of the $FeCo_Y$ layer and has thickness from about 20 to 40 Angstroms, the lower $FeCo_Y$ layer has a thickness between about 2 and 10 Angstroms, and the first layer that is $Co_UFe_WB_Z$ is the uppermost layer in the trilayer configuration and has a thickness of about 5 to 20 Angstroms.

4. The magnetoresistive element of claim 1 wherein the lower $FeCo_Y$ layer and the first layer that is a $CoFe_V$ layer each have a thickness between about 2 and 10 Angstroms, and the $CoB_X$ layer is the uppermost layer in the trilayer configuration and has a thickness from about 20 to 40 Angstroms.

5. The magnetoresistive element of claim 1 wherein the lower $FeCo_Y$ layer has a thickness of about 2 to 10 Angstroms, the first layer is FeB with a thickness of about 2 to 10 Angstroms, and the $CoB_X$ layer has a thickness from about 20 to 40 Angstroms and is the uppermost layer in the trilayer configuration.

* * * * *